United States Patent [19]

Hochberg

[11] 3,966,577

[45] June 29, 1976

[54] DIELECTRICALLY ISOLATED SEMICONDUCTOR DEVICES

[75] Inventor: Arthur K. Hochberg, Torrance, Calif.

[73] Assignee: TRW Inc., Los Angeles,, Calif.

[22] Filed: May 3, 1974

[21] Appl. No.: 466,722

Related U.S. Application Data

[62] Division of Ser. No. 392,039, Aug. 27, 1973, abandoned.

[52] U.S. Cl. .................................. 204/192; 156/7; 156/17; 29/578; 29/580; 357/49; 357/50
[51] Int. Cl.² ................ C23C 15/00; H01L 21/302; H01L 21/314
[58] Field of Search ............. 204/192, 129.1, 129.3; 156/17, 7; 29/578, 580; 357/49, 50

[56] References Cited
UNITED STATES PATENTS

| | | | |
|---|---|---|---|
| 3,416,224 | 12/1968 | Armstrong et al. | 357/49 X |
| 3,421,205 | 1/1969 | Pollock | 357/49 X |
| 3,423,651 | 1/1969 | Legat et al. | 317/235 |
| 3,436,327 | 4/1969 | Shockley | 204/192 |
| 3,531,857 | 10/1970 | Iwamatsu | 357/49 X |
| 3,616,348 | 10/1971 | Greig | 204/143 R |
| 3,649,503 | 3/1972 | Terry | 204/192 |
| 3,676,317 | 7/1972 | Harkins, Jr. | 204/192 |
| 3,692,655 | 9/1972 | Vossen, Jr. | 204/192 |
| 3,713,922 | 1/1973 | Lepselter et al. | 156/16 |
| 3,738,883 | 6/1973 | Bean et al. | 156/17 |

OTHER PUBLICATIONS

L. Maissel et al., Editors, "Handbook of Thin Film Technology" McGraw–Hill, N.Y. 1970, pp. 7-48 to 7-53.

*Primary Examiner*—John H. Mack
*Assistant Examiner*—Aaron Weisstuch

[57] ABSTRACT

The invention is a method of fabricating dielectrically isolated semiconductor regions adapted for the construction of an integrated circuit on an epitaxial wafer wherein the epitaxial wafer has a first layer of monocrystalline n+ type silicon of a predetermined thickness and a second layer of epitaxially deposited n-type silicon which is substantially thinner than the first layer. A layer of silicon dioxide is grown on the back side of the first layer of the wafer and a layer of polycrystalline silicon is deposited onto the silicon dioxide layer. An aluminum oxide mask is formed defining a plurality of grooves around active semiconductor regions within the n-type silicon layer. The grooves are formed by a sputter etching process. Silicon dioxide is thermally grown within each of the grooves exposed by the sputter etching process to dielectrically isolate the active semiconductor regions after which semiconductor devices may be formed in each of the active semiconductor regions.

4 Claims, 16 Drawing Figures

DIELECTRICALLY ISOLATED SEMICONDUCTOR DEVICES

This is a division of application Ser. No. 392,039, filed Aug. 27, 1973, abandoned.

BACKGROUND OF THE INVENTION

1. Field of the Invention

This invention relates to the fabrication of a structure adapted for the construction of an integrated circuit network and more particularly to the fabrication of a structure having dielectrically isolated active semiconductor regions in which dielectrically isolated semiconductor devices are formed.

2. Prior Art

There have been a number of prior art approaches to the problem of isolating electrical elements which form an integrated circuit. The term integrated circuit is employed herein and includes thin film integrated circuits as well as semiconductor monolithic and hybrid integrated circuits. One prior art approach for dielectrically isolating active elements is disclosed in U.S. Pat. No. 3,158,788 issued to J. T. Last on Nov. 24, 1964. Last employed a barrier of added dielectric isolating material to isolate the elements of the circuit. While this method has definite advantages, it does not provide maximum elemental density. Other prior art patents such as U.S. Pat. No. 3,100,276 issued to O. L. Meyer on Aug. 6, 1963 and U.S. Pat. No. 3,189,798 issued to C. E. Benjamin on June 15, 1965 have attempted various arrangements of grooves alone or in combination with pn junctions to partially isolate the semiconductor devices forming integrated circuits.

U.S. Pat. No. 3,695,160 issued to Sloan, Jr. et al., on Apr. 25, 1972, teaches an orientation dependent etching technique employed in the fabrication of monolithic semiconductor devices forming an integrated circuit network providing both electrical isolation of the devices and an increase in elemental density. The electrical isolation is attained by an epitaxial layer of one conductivity type placed on a substrate of an opposite conductivity type. This patent does not teach dielectric isolation of semiconductor devices. The Armstrong devices are located in a monocrystalline wafer upon which an oxide layer is grown or deposited, and the wafer is mounted on a polycrystalline substrate. The devices are chemically etched to the polycrystalline substrate through the oxide layer to dielectrically isolate each device. This is presently a standard technique for dielectrically isolating semiconductor devices. Difficulties have arisen in applying this technique to fabrication of microwave semiconductor devices because the monocrystalline substrate must be of a controlled thickness to provide electrically matched devices. U.S. Pat. No. 3,489,961 issued to Frescara et al. on Jan. 13, 1970 teaches dielectric isolation of microwave semiconductor devices. Frescara's patent discloses a method of forming an integrated circuit structure including the steps of:

1. depositing a first type n+ epitaxial layer onto an n-type monocrystalline wafer;
2. depositing a second n-type epitaxial layer on the first epitaxial layer;
3. doping the second n-type epitaxial layer with donor and acceptor impurities to form p and n-type regions of a semiconductor device;
4. forming an oxide mask over the second epitaxial layer exposing regions for metallization;
5. metallizing these regions to form ohmic contacts with p and n regions of the semiconductor device;
6. adhering an oxide coated supporting substrate to the second layer of the wafer; and
7. etching grooves through to the oxide layer of the supporting substrate to isolate each semiconductor device.

U.S. Pat. No. 3,579,391 entitled "Method of Producing Dielectric Isolation for Monolithic Circuit" issued to James L. Buie on May 18, 1971, teaches a method of forming a structure of dielectrically isolated semiconductor regions which include the steps of lapping and polishing an active n-type region within which semiconductor devices are to be formed. This presently practiced method of the prior art begins with an nn+ epitaxial wafer wherein the epitaxial wafer has a first layer of monocrystalline n-type silicon of a predetermined thickness and a second layer of monocrystalline n-type silicon epitaxially deposited onto the first layer which is substantially thinner than the first layer. A plurality of grooves are etched through the second layer and approximately halfway through the first layer. Silicon dioxide is thermally grown both on the surface of the grooves and on the second surface of the wafer. Polycrystalline silicon is deposited onto the silicon dioxide layer. The first layer of a n-type silicon is lapped until a portion of the silicon dioxide layer in each groove is exposed thereby forming a plurality of active semiconductor device regions. The lapping and polishing processes often damage the first layer of n-type silicon. Furthermore, the lapping and polishing processes do not always insure identical thicknesses of isolated active semiconductor regions within the limit imposed by the original wafer. Often dielectrical isolation of an active semiconductor region is not achieved because of variations in thickness and parellelism of the original wafer.

The principal disadvantage of the above disclosed prior art method is in the difficulty in lapping parallel to the original surface and in controlling the thickness of the original undiffused portion of the dielectrically isolated first epitaxial layer to within plus or minus one-half micron. In all the above methods of the prior art the basic problem is to control the thickness of the devices so that they may be used for microwave application. It should be noted that the other patents have drawings which are not drawn to scale and that layers of semiconductor material which are five to seven microns in thickness are difficult to achieve and are in fact not realized by any of the above prior art methods. The present invention combines the use of an epitaxial technique and a sputter etching technique to produce dielectrically isolated active semiconductor regions which are uniform both in thickness and in parallelism. It is therefore an object of the present invention to provide uniform structures of dielectrically isolated active semiconductor regions on a common wafer. It is another object of the present invention to provide an increase in the density of dielectrically isolated active semiconductor regions over that normally achieved by prior art methods of dielectrically isolating active semiconductor regions. It is also another object of the present invention to eliminate damaging material removal procedures used in the prior art methods of dielectrically isolating active semiconductor regions.

It is still another object of the present invention to provide a method for dielectrically isolating active semiconductor regions on a wafer which is insensitive to nonuniformities in the thickness and parallelism of the original wafer.

SUMMARY OF THE INVENTION

Various prior art methods have been used to dielectrically isolate active semiconductor regions on a wafer. All of these methods have used a chemical etching process to achieve dielectrical isolation of the active semiconductor regions. The present invention makes use of a sputter etching process to achieve dielectrical isolation of the active semiconductor regions. A monocrystalline n+ type silicon wafer of a predetermined thickness has a silicon dioxide grown layer grown on one of its surfaces and has a layer of polycrystalline silicon deposited on the silicon dioxide layer. Epitaxial layer of monocrystalline n-type silicon is formed on the opposed surface of the monocrystalline n+ type silicon wafer and it is substantially thinner than the wafer.

The method of isolating a plurality of active semiconductor regions as taught by the present invention is to place an aluminum oxide mask over the plurality of semiconductor regions to be dielectrically isolated. The silicon wafer containing the plurality of semiconductor regions is placed on a cathode of a sputtering apparatus and the aluminum oxide and the silicon are sputtered off to form a groove surrounding each active semiconductor region. The sputter etching continues until the bottom of each groove has reached the silicon dioxide layer between the monocrystalline silicon wafer and the polycrystalline substrate. The use of sputter etching is based on the principle that aluminum oxide mask material sputters at a lower rate that n+ type silicon under certain controlled conditions and that little lateral etching takes place. By controlling the conditions, a processor is able to dielectrically isolate active semiconductor regions minimally spaced as close as 5 microns apart; there of course being no upper limit. This distance compares favorably to much larger distances, typically 70 microns, achieved by the prior art methods employing a chemical etching. As indicated, there is no lateral etching which normally occurs as a result of the chemical etching process being isotropic, because the aluminum oxide mask acts as a true mask and protects that which is directly beneath it from being sputter etched. A semiconductor device may be formed in each dielectrically isolated active semiconductor region. The foregoing and other objects and advantages of the present invention will be apparent from the following more particular description of the preferred embodiment of the invention as illustrated in the accompanying drawings.

DESCRIPTION OF THE PREFERRED EMBODIMENT

Figure 1:
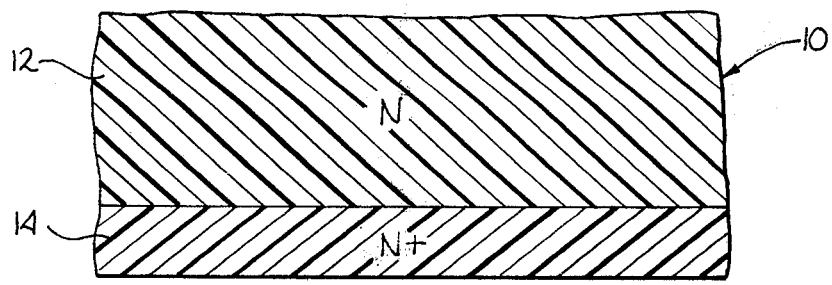
FIG. 1 is a diagrammatic cross-sectional view of an epitaxial wafer having a first layer of n-type monocrystalline silicon of a predetermined thickness and a second layer of epitaxially deposited monocrystalline n+ type silicon which is substantially thinner than the first layer.

The preferred embodiment of the present invention can best be understood by comparing it to a structure formed by a prior art method. Referring to FIG. 1 nn+ epitaxial wafer 10 has a first layer 12 of monocrystalline n-type silicon of a predetermined thickness, typically 70 microns, and second layer 14 of epitaxially deposited monocrystalline n+ type silicon which is substantially thinner than layer 12, typically being from 5 to 7 microns.

Figure 2:
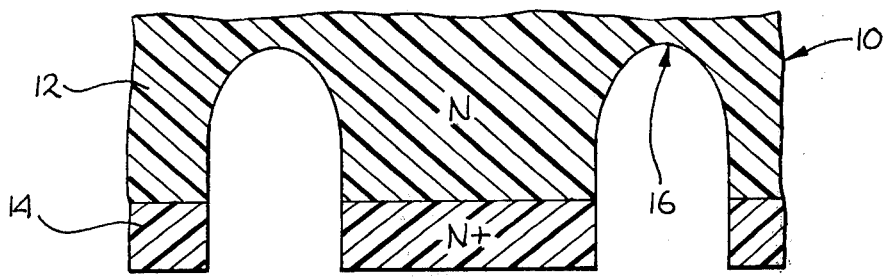
FIG. 2 is a diagrammatic cross-sectional view of the epitaxial wafer after a plurality of grooves has been formed through the second layer and approximately halfway through the first layer of the epitaxial wafer.
Figure 3:
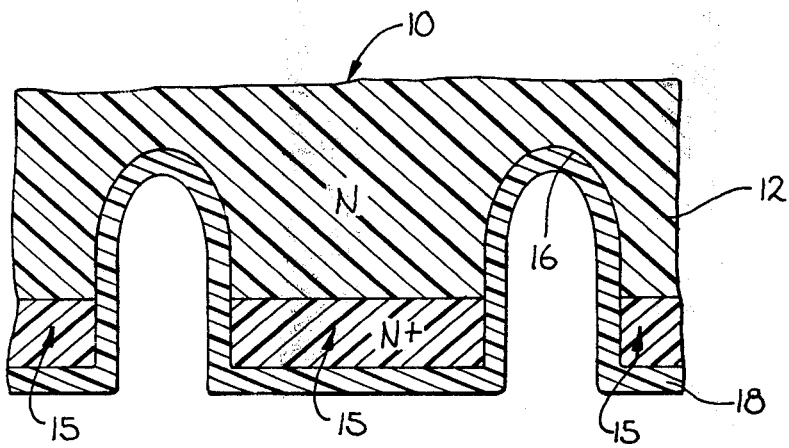
FIG. 3 is a diagrammatic cross-sectional view of the epitaxial wafer in FIG. 2 illustrating the wafer after a silicon dioxide layer has been grown on the second layer and within each groove.
Figure 4:
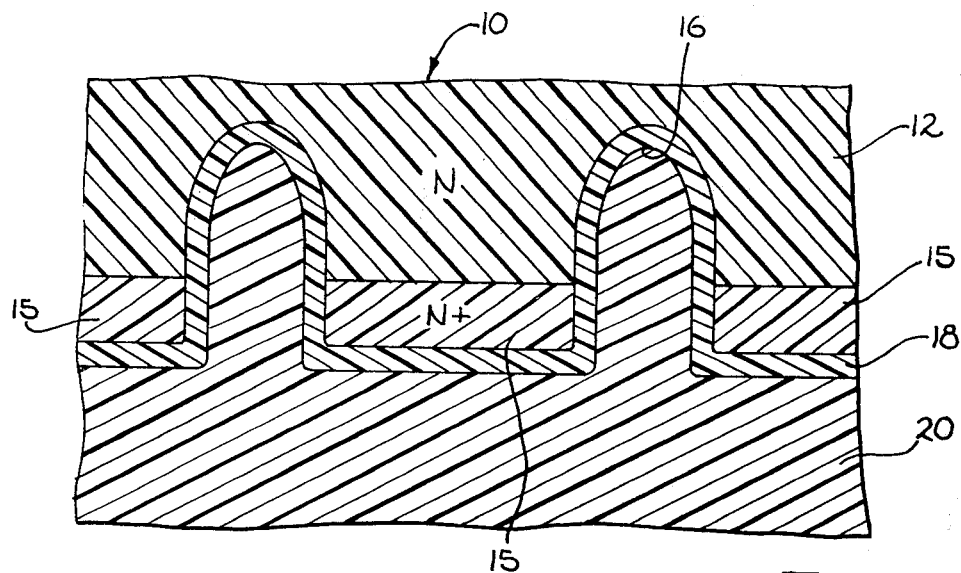
FIG. 4 is a diagrammatic cross-sectional view of the epitaxial wafer in FIG. 3 illustrating the wafer after polycrystalline silicon has been deposited onto the second layer of the wafer and into each of the grooves.

Referring to FIG. 2, wafer 10 has been chemically etched through second layer 14 and halfway through first layer 12 to form a plurality of grooves 16, the depth of which is approximately forty microns, and a plurality of isolated n+ islands 15. Isolating layer 18 of silicon dioxide is thermally grown over islands 15 and within each groove 16 as illustrated in FIG. 3. Substrate 20 of polycrystalline silicon as shown in FIG. 4 is deposited onto isolating layer 18. Substrate 20 may be much thicker than epitaxial wafer 10.

Figure 5:
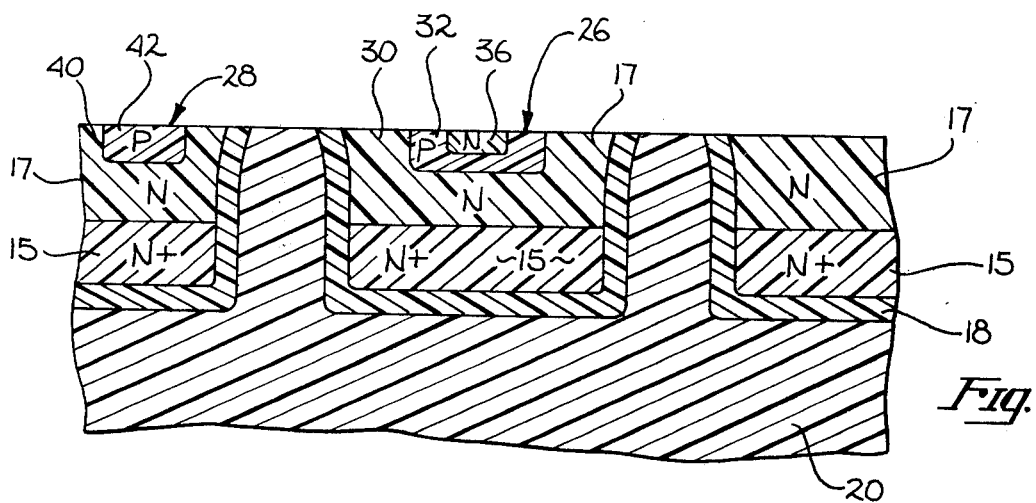
FIG. 5 is a diagrammatic cross-sectional view of the epitaxial wafer of FIG. 4 after the wafer has been lapped and polished to form dielectrically isolated active semiconductor regions of n-type silicon. In addition, the results of further processing to form p-n and n-p-n structures is shown.

In this prior art method the critical steps in the achievement of dielectrical isolation of semiconductor regions are the lapping and polishing of first layer 12 of epitaxial wafer 10. First layer 12 is lapped until isolating layer 18 is exposed through first layer 12 as shown in FIG. 5 so as to isolate a plurality of sections 17 of layer 12 which correspond to the islands 15. The lapping step of the prior art method is a critical step but it is difficult to achieve planarity and to control the thickness of first layer 12.

FIG. 5 illustrates an integrated circuit network comprising transistor 26 and diode 28 which has been formed in the prior art structure. The transistor 26 has been formed by a controlled diffusion of a p-type impurity into first active semiconductor region 30 to form base region 32 and a subsequent and more limited area diffusion of an n-type impurity into a portion of base region 32 to form emitter region 36. First layer 12, as previously mentioned, itself has a suitable impurity deposited therein through which to impart the desired conductivity type so that section 17 may function along with island 15 as collector region 30 of transistor 26. Similarly diode 28 has been formed by a controlled diffusion of a p-type impurity into a portion 40 of second active semiconductor region 40 to form cathode region 42. Isolated section 17 and island 15 function as an anode region of diode 28.

Figure 6:
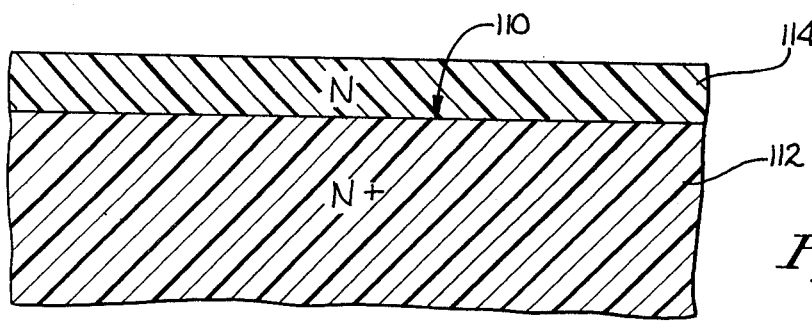
FIG. 6 is a diagrammatic cross-sectional view of an epitaxial wafer having a first layer of n+ type silicon of a predetermined thickness and a second layer of epitaxially deposited monocrystalline n-type silicon which is substantially thinner than the first layer.

Referring now to FIG. 6 for comparison with the above described prior art structure, a first preferred embodiment of the present invention is shown at an early stage of manufacture wherein an epitaxial wafer 110 is shown having a first layer 112 of n+ type monocrystalline silicon of a predetermined thickness, typically 70 microns, and a second layer 114 of epitaxially deposited monocrystalline n-type silicon which is substantially thinner than first layer 112, typically 5 to 7 microns. Epitaxial wafer 110 may be any commonly manufactured epitaxial wafer about which substantial technical information is known.

The preferred embodiment of the present invention described employs an nn+ epitaxial wafer of silicon, but a pp+ epitaxial wafer of silicon may also be employed in an alternative embodiment of the present invention. Furthermore, group IV elements other than silicon such as germanium may be used in either of the above embodiments of the present invention.

Figure 7:
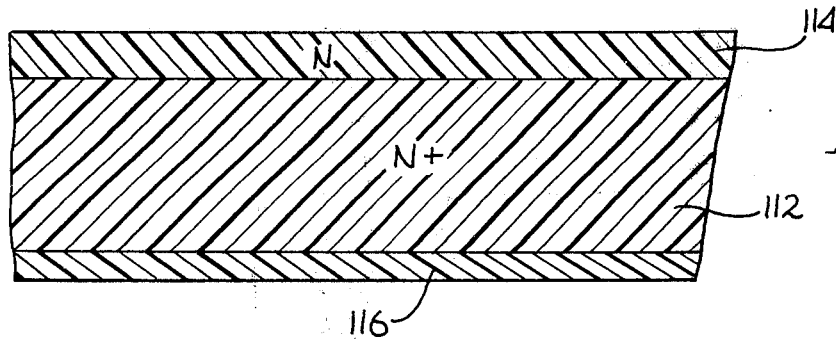
FIG. 7 is a diagrammatic cross-sectional view of the epitaxial wafer in FIG. 6 after a layer of silicon dioxide has been grown on the first layer of the epitaxial wafer.

Referring now to FIG. 7, isolating layer 116 is formed by thermally growing silicon dioxide on first layer 112 of wafer 110. Isolating layer 116 may be comprised of other dielectric materials including nitrides such as silicon nitrides and oxides other than silicon dioxide such as aluminum oxide in embodiments other than the preferred embodiment of the present invention.

Figure 8:
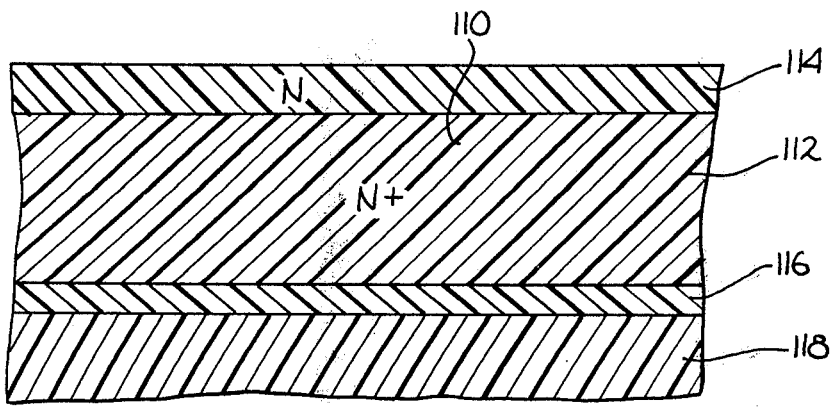
FIG. 8 is a diagrammatic cross-sectional view of the epitaxial wafer in FIG. 7 illustrating the wafer after a polycrystalline silicon layer has been deposited onto the silicon dioxide layer.

FIG. 8 illustrates wafer 110 after polycrystalline substrate 118 comprised of silicon has been formed by the deposition of silicon onto isolating layer 116. Semiconductor material other than silicon such as germanium may be used in other embodiments of the present invention.

Figure 9:
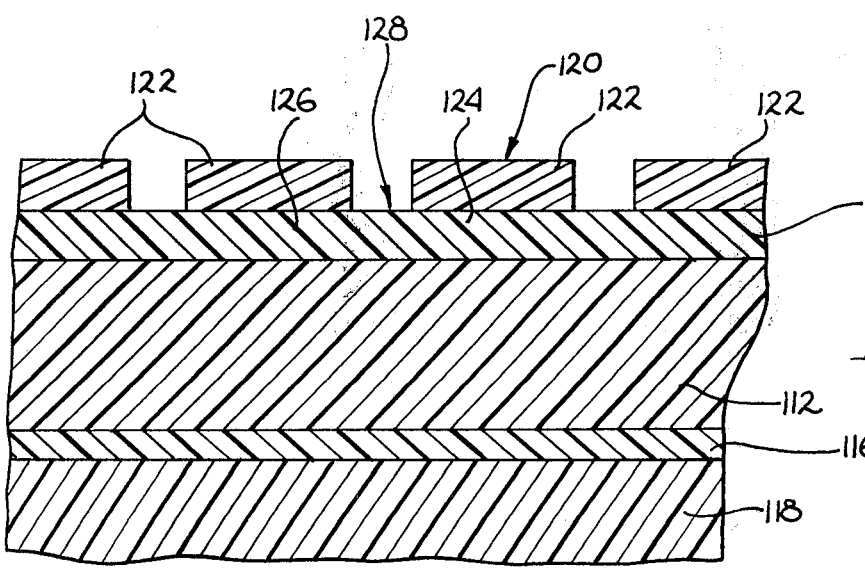
FIG. 9 is a diagrammatic cross-sectional view of the epitaxial wafer in FIG. 8 illustrating the formation of an aluminum oxide mask defining a plurality of grooves around active semiconductor regions.

As shown in FIG. 9, mask 120 is disposed on second layer 114 of wafer 110. Mask 120, which is comprised of aluminum oxide layer 122, is formed by etching away portions of aluminum oxide layer 122 by chemically etching with phosphoric acid. First active semiconductor region 124 and second active semiconductor region 126 are covered by mask 120. Unmasked areas of second layer 114 define groove areas 128 which completely surround the mask elements 120. In embodiments other than the preferred embodiment, other mask material may be used including metals such as aluminum and nitrides such as silicon nitrides.

Figure 10:
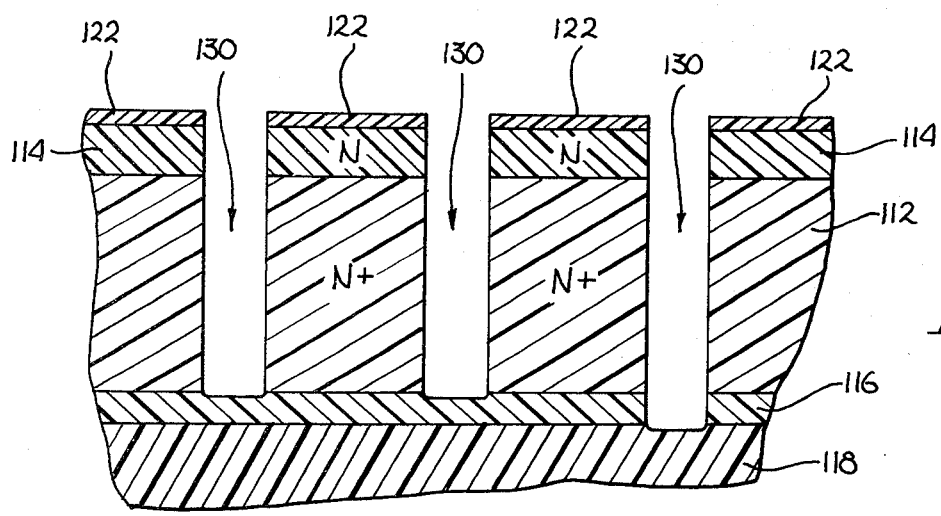
FIG. 10 is a diagrammatic cross-sectional view of the epitaxial wafer shown in FIG. 9 illustrating the wafer after the silicon in the first and second layer of the wafer which has not been covered by the aluminum oxide mask has been removed by sputter etching to form a plurality of grooves.

Referring to FIG. 10, the silicon in first and second layers 112 and 114 of wafer 110 is removed from groove areas 128 by sputter etching to form grooves 130. The invention may be similarly practiced by removing the silicon by plasma etching.

The remaining thickness of layer 122 of aluminum oxide is determined by the ratio of the sputtering rate of aluminum oxide to the sputtering rate of silicon, typically from between 1 to 12 and 1 to 20, and the thickness of first and second layers 112 and 114 of silicon, which are typically 75 to 100 microns and 6 to 8 microns, respectively. When wafer 110 is placed in a sputtering apparatus the aluminum oxide and the silicon are sputtered off at different rates. Sputtering is to continue until the silicon in first and second layers 112 and 114 of wafer 110 has been completely removed.

In a typical example where the ratio of the sputtering rate of aluminum oxide to the sputtering rate of silicon is 1 to 12, and the thickness of the silicon is 81 microns, mask 120 may be as thin as 6.75 microns, but more likely, it will be 7.5 microns thick to insure that no damage to second layer 114 occurs as a result of inadvertently having sputtered off the entire oxide layer 122.

Generally, the mask material is a low sputtering rate material. Silicon dioxide, silicon nitride and aluminum are examples of other materials which may be used even though the ratios of their sputtering rates to that of silicon are lower than the ratio for aluminum oxide. The thickness of mask 120 is a function of the ratio of the sputter rate of the mask material and the thickness of the semiconductor material of the first and second layer and the thickness of the semiconductor material.

In some applications of the present invention mask 120 may consist of a silicon dioxide layer and an aluminum oxide layer in order to provide more protection of the active semiconductor regions from sputtering and to simplify the removal of the remaining material of mask 120 after sputtering.

The other technique of removing silicon is plasma etching. Wafer 110 is placed in a cylindrical tube containing fluorine gas in the presence of RF power. Mask 120 and the silicon of first and second layers 112 and 114 are selectively removed. Plasma etching also occurs at different rates for each material and the thickness of mask 120 is similarly determined as it is above for sputter etching. The condition of the wafer after the sputtering step, as shown in FIG. 10 is a substrate comprised of layers 116 and 118 with a plurality of regions which are sections of layers 112, 114 and 122, each surrounded by grooves 130.

Figure 11:
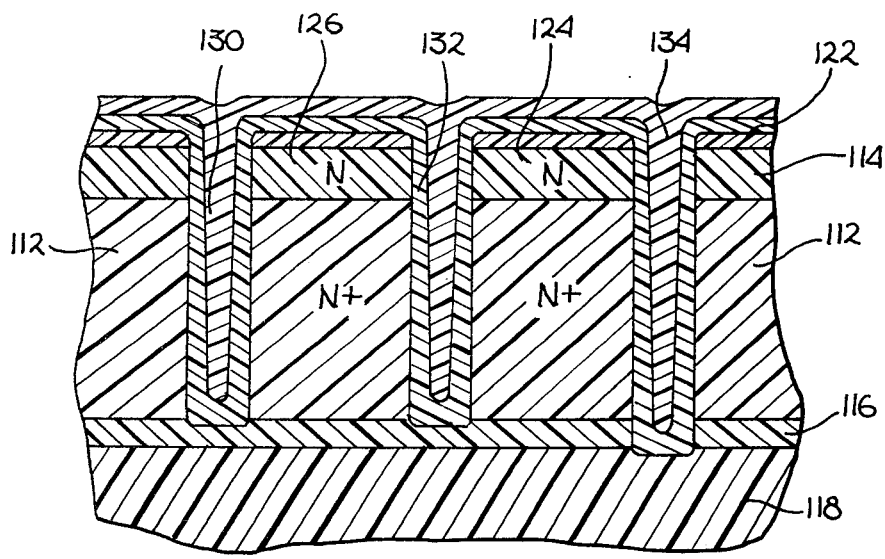
FIG. 11 is a diagrammatic cross-sectional view of the wafer shown in FIG. 10 after a region of silicon dioxide has been grown within each of the grooves.
Figure 12:
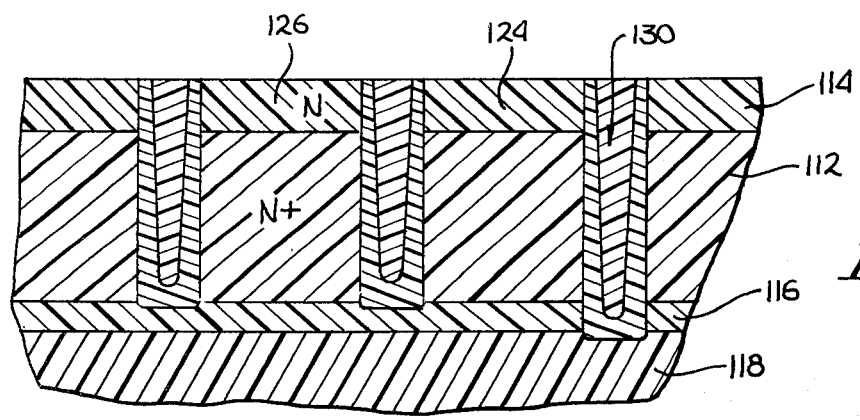
FIG. 12 is a diagrammatic view of the epitaxial wafer shown in FIG. 11 after the silicon dioxide material has been removed from the second layer of the epitaxial wafer to expose the active semiconductor regions.

The next step is to thermally grow or deposit silicon dioxide in each groove 130. The results of this step are illustrated in FIG. 11. Portion 132 of the silicon dioxide is thermally grown in the groove. If portion 132 does not fill the grooves (as is the case illustrated) additional material 134 may be deposited so as to insure mechanical stability of the isolated regions. The silicon dioxide overlying first and second active semiconductor regions 124 and 126 is then removed by chemically etching to expose a structure adapted for the formation of dielectrically isolated semiconductor devices. First and second active semiconductor regions 124 and 126 are shown dielectrically isolated in FIG. 12.

Figure 13:
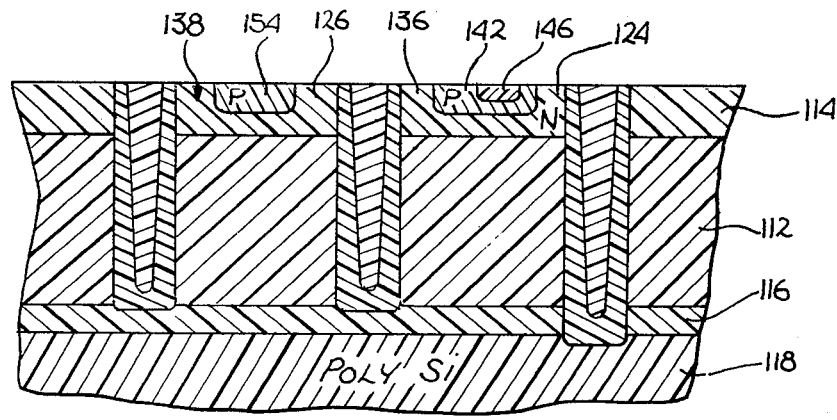
FIG. 13 is a diagrammatic cross-sectional view of a diode in one of the active semiconductor regions and a transistor in another of the regions.

FIG. 13 illustrates, for purposes of illustration, an integrated circuit network comprising dielectrically isolated transistor 136 disposed in first active semiconductor region 124 and diode 138 disposed in second active semiconductor region 126. Transistor 136 may be formed by a controlled diffusion of a selected impurity into a portion of first region 124 to form base region 142 and a subsequent and more limited area diffusion of an impurity of opposite conductivity type into a portion of base region 142 to form emitter region 146. First region 124, as previously mentioned, itself has a suitable impurity deposited therein through which to impart the desired conductivity type so that it may function along with first layer 112 as collector region of transistor 136. Similarly, diode 138 may be formed by a controlled diffusion of a selected impurity into a portion of second region 126 to form anode region 154. Second region 126 along with first layer 112 functions as cathode region of diode 138.

Electrical contacts (not shown) are next made to portions 126 and 154 of diode 138 and portions 124, 142 and 146 of transistor 136 by conventional techniques.

Figure 14:
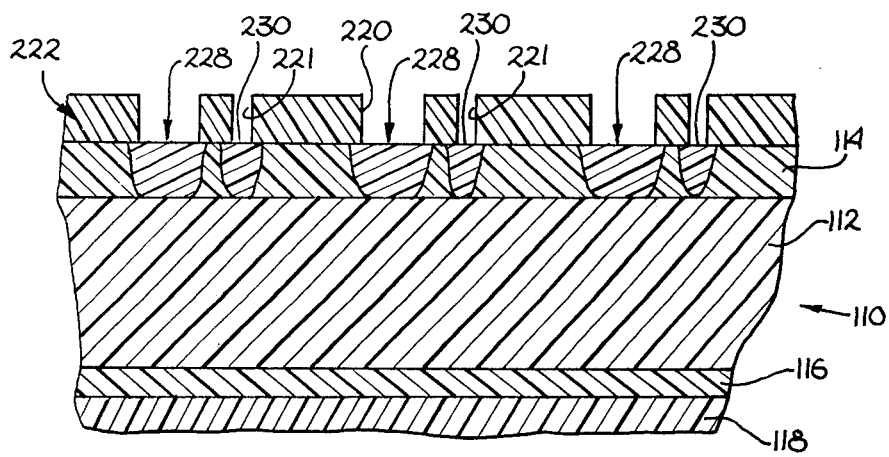
FIG. 14 is a diagrammatic cross-sectional view of the epitaxial wafer in FIG. 8 illustrating the formation of a mask layer defining a plurality of groove areas around active semiconductor regions and a plurality of contact areas to the n+ type silicon of the first layer. An n+ type diffusion into each groove area and each contact area is illustrated in FIG. 14.
Figure 15:
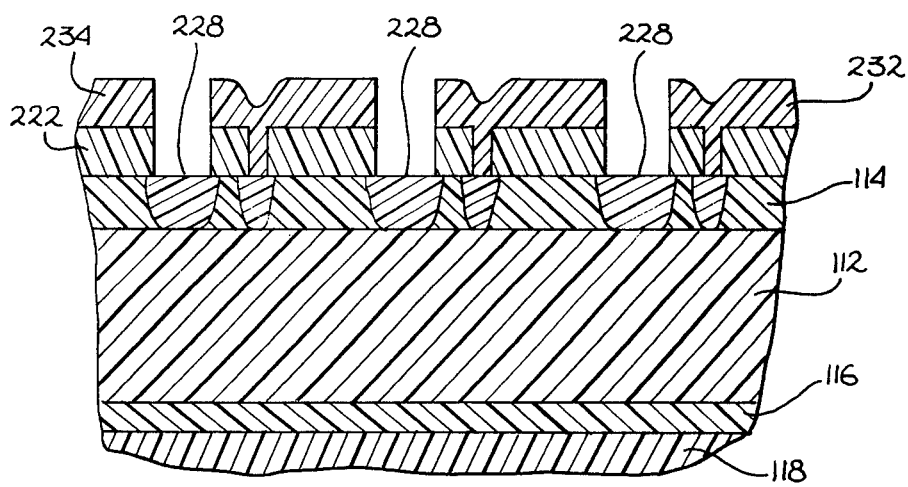
FIG. 15 is a cross-sectional view of the epitaxial wafer shown in FIG. 14 illustrating the formation of an aluminum oxide mask redefining the plurality of groove areas.
Figure 16:
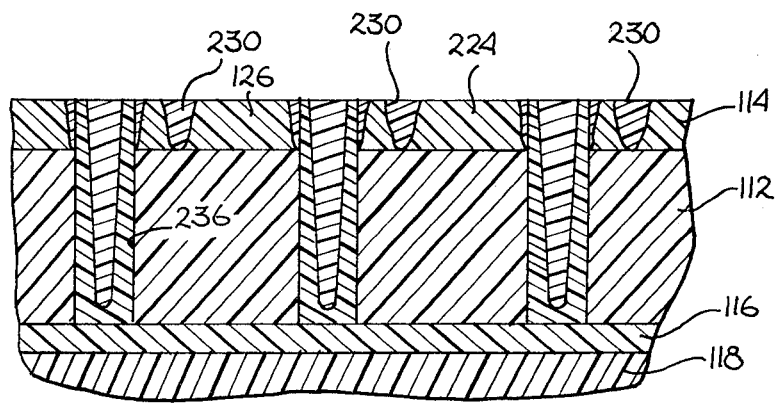
FIG. 16 is a cross-sectional view of the epitaxial wafer shown in FIG. 15 after the silicon of the first and second layers which has not been covered by the aluminum oxide mask has been removed by sputter etching to form a plurality of grooves and silicon dioxide has been thermally grown and deposited within each groove.

An alternative embodiment of the present invention is shown in FIGS. 14, 15 and 16. The alternate procedure, involves the sputter removal of only n+ type silicon instead of the combination of n and n+ as in the previously described embodiment. Since n+ type silicon has about three times the sputter removal rate as n-type silicon, less stringent requirements are placed on the characteristics and thickness of layer 120.

A wafer 110, as illustrated in FIG. 14 is prepared as previously described having layers 112 of n+ type silicon, 114 of n-type silicon, 116 of silicon dioxide, and a polycrystalline substrate 118. An aluminum oxide mask 222 having openings 220 and 221 is deposited on the layer 114. An n+ diffusion is then performed which results in n+ areas 228 and 230 extending through the n-type layer 114 in the regions of openings 220 and 221. The n+ areas 230 are optional and their description herein is intending to disclose how such n+ areas can be achieved in the method of this invention when such areas are desired, as for example, when an ohmic contact with an n+ area from the surface of the wafer is desired.

Next, a layer 234 of low sputtering rate material, for example aluminum oxide, is deposited over mask 222 and the areas corresponding to openings 220 are reopened. The condition after this step is shown in FIG. 15 in which it can be seen that the n+ areas 228 are exposed but not the n+ areas 230. The remainder of the processing is identical to that described above for the first embodiment. That is, material is removed both from the surface of layer 234 and from the portions of layers 114 and 112 directly exposed through openings 220. The material removed from layers 114 and 112 is n+ material only and not a combination of n and n+ as in the first embodiment and since n+ has a sputter rate of the order of three times that of n material, less time is required to remove all material down to layer 116 relative to the time to remove the entire layers 222 and 234. The thickness and sputter characteristics of layers 222 and 234 are thus less critical in that there is less danger of sputtering off all of layers 222 and 234 before reaching layer 116. The grooves 236 made in layers 112 and 114 are then filled with silicon dioxide and all remaining portions of aluminum oxide layers 222 and 234 are removed, as previously described. The finished wafer, as shown in FIG. 16 comprises electrically isolated portions of layers 112 and 114 as in the first embodiment but also having n+ areas 230, if desired.

The wafer may be further processed as described above to fabricate semiconductor devices in the isolated areas in accordance with standard techniques well known in the art as described above in connection with the first embodiment of the invention disclosed.

Some methods presently used for dielectrically isolating semiconductor devices on a common monocrystalline substrate involve chemical etching steps which ae customized for particular devices. No processing of a wafer beyond standard polishing or epitaxial depositions may be common for different device types. These methods are restricted in the number of wafers which may be processed simultaneously due to non-uniformities in wafer thickness and non-parallelism of wafer surfaces. Such shortcomings are overcome by the present invention.

Customized etching steps are usually performed on the <100> surfaces. The nature of chemical etching also results in a significant lateral removal of material in a groove in order to achieve a particular depth of removal. The resulting groove widening limits the density of isolated regions obtainable on a surface of a wafer. In contrast to the prior art method the sputter etching method produces grooves which are typically from as little as 5 microns; of course, there is no practical upper limit in width as compared to the prior art techniques where grooves are typically 70 microns in width as a minimum. Sputter etching does not waste large surface areas of the wafer by groove widening, because the sputter etch mask shields the silicon material directly beneath it from being sputter etched.

In the preferred embodiment of the present invention each active semiconductor region is of a uniform thickness and parallelism, because an epitaxial layer of six to eight microns can be controlled to within plus or minus one-half micron throughout the surface of an epitaxial wafer. Furthermore, wafer 110 may be any one of a number of commonly manufactured semiconductor wafers of which an extensive history of their performance is known. Using epitaxial n-type second layer 114 as the active semiconductor regions also eliminates the lapping and polishing steps of the prior art method. Wafer 10 after completion of the lapping and polishing steps, which often damage the active semiconductor regions, was illustrated in FIG. 5. The use of epitaxially deposited second layer 114 also insures relatively identical thicknesses of dielectrically isolated active semiconductor regions within the limits imposed on by the condition of original first layer 112 of wafer 110. Isolation of all active semiconductor regions, regardless of any variation in thickness and parallelism of wafer 110 is assured by the ability to over-etch the grooves beyond the isolating layer in order to insure isolation of all islands as shown in FIG. 13.

Among the principal advantages of the present invention incorporating sputter or plasma etching techniques are the small isolation groove widths attainable, approximately 5 microns; of course, there is no practical upper limit in width as compared to 70 microns in width of isolation area formed by other techniques. This reduction in width of the isolation area allows semiconductor devices to be more densely packed on a semiconductor wafer.

Another advantage of the present invention is that the use of an epitaxial active layer can be controlled in thickness to within 1 micron. The uniformity of the resulting semiconductor devices is such that they are useful in microwave applications.

A further advantage is realized by the use of the epitaxial active layer because the epitaxial layer can be uniformly doped with an inpurity to provide any desired conductivity.

A yet further advantage is realized in that commonly manufactured wafers may be adapted to be processed simultaneously and uniformly.

Still another advantage is that all isolated active areas will be identical in thickness, within the limits imposed by the original layers, regardless of warpage and nonplanarity of surfaces.

A further advantage is that no mechanical damage is imposed on active areas by lapping and polishing.

While the invention has been particularly shown and described with reference to a preferred embodiment thereof, it will be understood by those skilled in the art that various changes in form and details may be made therein without departing from the spirit of the invention.

What is claimed is:

1. A method of forming a structure adapted for construction of integrated circuit devices on an epitaxial wafer having a first layer of monocrystalline semiconductor material of a predetermined conductivity type and active impurity concentration and of a predetermined thickness, and a second layer of epitaxially deposited monocrystalline semiconductor material of the same conductivity type, but of a lower concentration of active impurities than that of said first layer, said second layer being substantially thinner than said first layer, including the steps of:
   a. forming an isolating layer on said first layer of said wafer;
   b. forming a polycrystalline semiconductor material onto said isolating layer;
   c. forming a mask on said second layer to define groove regions between a plurality of active semiconductor regions;
   d. diffusing impurity dopants of the same conductivity type as that of said first layer into said groove region of said second layer; and
   e. removing said semiconductor material in said first and second layer within said groove regions by bombardment of said semiconductor material with charged particles accelerated across a potential difference to form a plurality of grooves in said groove regions, said groove extending into said first and second layers at least to said isolating layer.

2. A method of forming a structure adapted for construction of integrated circuit devices on an epitaxial wafer having a first layer of monocrystalline semiconductor material of a predetermined conductivity type and active impurity concentration and of a predetermined thickness, and a second layer of epitaxially deposited monocrystalline semiconductor material of the same conductivity type, but of a lower concentration of active impurities than that of said first layer, said second layer being substantially thinner than said first layer, including the steps of:
   a. forming an isolating layer on said first layer of said wafer;
   b. forming a polycrystalline semiconductor material onto said isolating layer;
   c. forming a first mask on said second layer to define groove regions between a plurality of active semiconductor regions and to define a plurality of contact regions in each active semiconductor region;
   d. diffusing impurity dopants of the same conductivity type as that of said first layer into said groove regions of said second layer and into said plurality of contact regions to form a plurality of contact strips and a plurality of regions having substantially the same susceptibility for removal as said first layer;
   e. forming a second mask on said second layer and first mask to redefine said plurality of groove regions; and
   f. removing said semiconductor material in said first and second layers by bombardment with charged particles to form a plurality of grooves in said redefined groove regions each of said grooves extending into said first and second layers at least to said isolating layer.

3. A method of forming a structure adapted for construction of integrated circuit devices on an nn+ epitaxial wafer, wherein said nn+ epitaxial wafer has a first layer of n+ type monocrystalline silicon of a predetermined thickness and a second layer of epitaxially deposited n-type monocrystalline silicon, said second layer being substantially thinner than said first layer, including the steps of:
   a. forming a silicon dioxide layer on said first layer of said wafer;
   b. depositing polycrystalline silicon onto said silicon dioxide layer;
   c. forming a first aluminum oxide mask on said second layer to define a plurality of groove regions between a plurality of active semiconductor regions and to define a plurality of contact regions in each active semiconductor region;
   d. placing an n+ type impurity and a dopant into each groove region and each contact region;
   e. forming a second aluminum oxide mask on said second layer and first aluminum oxide mask to redefine said groove regions; and
   f. removing by sputter etching said silicon in said first and second layers of said wafer to form a plurality of grooves in said groove regions, each of said grooves extending into said first and second layers at least to said isolating layer.

4. A method of forming a structure adapted for construction of integrated circuit devices on an nn+ epitaxial wafer, wherein said nn+ epitaxial wafer has a first layer of n+ type monocrystalline silicon of a predetermined thickness and a second layer of epitaxially deposited n-type monocrystalline silicon, said second layer being substantially thinner than said first layer, including the steps of:
- a. forming a silicon dioxide layer on said first layer of said wafer;
- b. depositing polycrystalline silicon onto said silicon dioxide layer;
- c. forming a first aluminum oxide mask on said second layer to define a plurality of groove regions between a plurality of active semiconductor regions and to define a plurality of contact of regions in each active semiconductor region;
- d. placing an n+ type impurity and a dopant into each groove region and each contact region of said second layer;
- e. forming a second aluminum oxide mask on said second layer and said first aluminum oxide mask to redefine said groove regions; and
- f. removing by plasma etching said silicon in said first and second layers of said wafer to form a plurality of grooves in said groove regions, each of said grooves extending into said first and second layers at least to said isolating layer.

* * * * *